(12) United States Patent
Murakami et al.

(10) Patent No.: US 9,818,582 B2
(45) Date of Patent: Nov. 14, 2017

(54) PLASMA PROCESSING METHOD

(71) Applicant: TOKYO ELECTRON LIMITED, Tokyo (JP)

(72) Inventors: Hiraku Murakami, Miyagi (JP); Nobutaka Sasaki, Miyagi (JP); Shigeru Senzaki, Miyagi (JP); Takanori Banse, Miyagi (JP); Hiroshi Tsujimoto, Miyagi (JP); Keigo Toyoda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/180,672

(22) Filed: Jun. 13, 2016

(65) Prior Publication Data

US 2016/0372308 A1    Dec. 22, 2016

(30) Foreign Application Priority Data

Jun. 17, 2015  (JP) .................................. 2015-122218

(51) Int. Cl.
*H01J 37/32* (2006.01)

(52) U.S. Cl.
CPC .... *H01J 37/3244* (2013.01); *H01J 37/32477* (2013.01); *H01J 37/32504* (2013.01)

(58) Field of Classification Search
None
See application file for complete search history.

(56) References Cited

U.S. PATENT DOCUMENTS

| | | | | |
|---|---|---|---|---|
| 6,846,742 B2* | 1/2005 | Rossman | ............ | C23C 16/4404 134/11 |
| 2005/0136604 A1* | 6/2005 | Al-Bayati | ............. | H01J 37/321 438/301 |
| 2009/0194233 A1* | 8/2009 | Tamura | ............... | C23C 16/4404 156/345.1 |
| 2010/0105209 A1* | 4/2010 | Winniczek | ........ | H01J 37/32082 438/696 |
| 2014/0272341 A1* | 9/2014 | Duan | ................ | H01L 21/68757 428/212 |

FOREIGN PATENT DOCUMENTS

JP          2015-5755 A      1/2015

* cited by examiner

*Primary Examiner* — Allan Olsen
(74) *Attorney, Agent, or Firm* — Rothwell, Figg, Ernst & Manbeck, P.C.

(57) ABSTRACT

Disclosed is a plasma processing method. The method includes forming a protective film on an inner wall surface of a processing container of a plasma processing apparatus; and executing a processing on a workpiece within the processing container. When forming the protective film, a protective film forming gas is supplied from an upper side of the space between the mounting table and the side wall of the processing container so that plasma is generated. When executing the processing, a workpiece processing gas is supplied from an upper side of the mounting table so that plasma is generated.

7 Claims, 7 Drawing Sheets

PLASMA PROCESSING METHOD

CROSS-REFERENCE TO RELATED APPLICATIONS

This application is based on and claims priority from Japanese Patent Application No. 2015-122218, filed on Jun. 17, 2015, with the Japan Patent Office, the disclosure of which is incorporated herein in its entirety by reference.

TECHNICAL FIELD

Exemplary embodiments of the present disclosure relate to a plasma processing method.

BACKGROUND

A plasma processing apparatus is used in manufacturing an electronic device called a semiconductor device. The plasma processing apparatus generally includes a processing container, a mounting table, and an ejection unit. The mounting table is provided within the processing container, and is configured to mount an object to be processed (hereinafter, referred to as "workpiece") thereon. The ejection unit is configured to eject a gas toward the workpiece supported by the mounting table. In the plasma processing apparatus, plasma of the gas is generated to process the workpiece. One example of such a plasma processing apparatus is disclosed in Japanese Patent Laid-Open Publication No. 2015-005755.

The plasma processing apparatus disclosed in Japanese Patent Laid-Open Publication No. 2015-005755 is a capacitively coupled plasma processing apparatus in which an upper electrode provides an ejection unit. That is, the upper electrode has a shower head structure. Like the upper electrode, the ejection unit is generally provided above the mounting table.

SUMMARY

In an aspect, a plasma processing method is provided. The plasma processing method includes a step of forming a protective film on an inner wall surface of a processing container of a plasma processing apparatus (hereinafter, this step will be referred to as a "protective film forming step"), and a step of executing a processing on a workpiece within the processing container (hereinafter, the step will be referred to as a "processing step"). The plasma processing apparatus includes a mounting table, a first ejection unit, and a second ejection unit. The mounting table is provided within the processing container. The mounting table is configured to mount the workpiece thereon. The first ejection unit is provided above the mounting table, and configured to eject a gas toward the workpiece mounted on the mounting table. The second ejection unit is provided on a side wall of the processing container with respect to the first ejection unit, and configured to eject a gas from an upper side of a space between the mounting table and the side wall of the processing container toward the space. In the protective film forming step, a protective film forming gas is ejected from the second ejection unit to generate plasma. In the processing step, a workpiece processing gas is ejected from the first ejection unit in a state where the workpiece is mounted on the mounting table to generate plasma.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
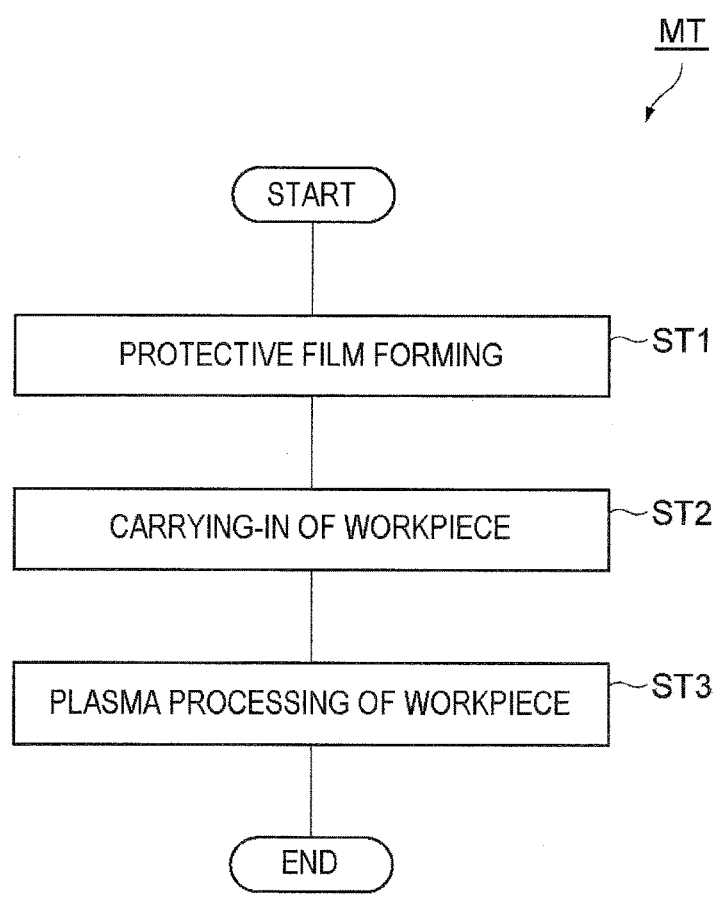
FIG. 1 is a flowchart illustrating a plasma processing method according to an exemplary embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

There is a case in which a protective film is formed on the inner wall surface of a processing container prior to performing a processing on a workpiece in order to suppress a contaminant (e.g., particles), which is generated from the inner wall surface of the processing container, from adhering to the workpiece. The formation of the protective film is generally performed in the state where a dummy substrate is mounted on the mounting table in order to prevent the protective film from being formed on the top surface of the mounting table. However, since it becomes necessary to perform carry-in/out the dummy substrate before and after the processing for forming the protective film, the use of the dummy substrate in forming a protective film deteriorates throughput.

Accordingly, in a technology of forming a protective film on the inner wall surface of a processing container of a plasma processing apparatus, it is required to suppress the formation of a protective film on the top surface of a mounting table without using a dummy substrate.

In an aspect, a plasma processing method is provided. The plasma processing method includes a step of forming a protective film on an inner wall surface of a processing container of a plasma processing apparatus (hereinafter, this step will be referred to as a "protective film forming step"), and a step of executing a processing on a workpiece within the processing container (hereinafter, the step will be referred to as a "processing step"). The plasma processing apparatus includes a mounting table, a first ejection unit, and a second ejection unit. The mounting table is provided within the processing container. The mounting table is configured to mount the workpiece thereon. The first ejection unit is provided above the mounting table, and configured to eject a gas toward the workpiece mounted on the mounting table. The second ejection unit is provided at a side wall side of the processing container with respect to the first ejection unit, and configured to eject a gas from an upper side of a space between the mounting table and the side wall of the processing container toward the space. In the protective film forming step, a protective film forming gas is ejected from the second ejection unit to generate plasma. In the processing step, a workpiece processing gas is ejected from the first ejection unit in a state where the workpiece is mounted on the mounting table to generate plasma.

In the above-described method, a protective film forming gas is ejected from the second ejection unit along the side wall of the processing container, and flows to a lateral side of the mounting table. Accordingly, a protective film is formed on the side wall (inner wall surface) of the processing container, but is not practically formed on the top surface of the mounting table. Thus, according to the present method, it becomes possible to form a protective film on the inner wall surface of a processing container of a plasma processing apparatus, and to suppress the formation of a protective film on the top surface of a mounting table without using a dummy substrate.

In an exemplary embodiment, a baffle plate formed with a plurality of through holes is provided between the mounting table and the side wall. In addition, an exhaust apparatus is connected to the processing container below the baffle plate. According to this exemplary embodiment, the gas flow directed to the top surface of the mounting table from the second ejection unit is further suppressed.

In an exemplary embodiment, an etching target layer is etched in the processing step. That is, the processing of the workpiece in the processing step may be plasma etching.

In an exemplary embodiment, the protective film forming gas may be a silicon containing gas. From the silicon containing gas, a protective film containing silicon is formed. The protective film has a resistance against active species that are used for etching a film such as, for example, an anti-reflection film, a carbon containing film, a silicon oxide film, or a silicon nitride film.

In an exemplary embodiment, the protective film forming gas may further include a hydrocarbon gas or a hydrofluorocarbon gas. According to this protective film forming gas, a protective film PF forming speed, i.e., a deposition rate is enhanced. In addition, a harder protective film PF is formed.

In an exemplary embodiment, the plasma processing apparatus is a capacitively coupled plasma processing apparatus, and further includes an upper electrode provided above the mounting table. In an exemplary embodiment, the upper electrode may include the first ejection unit.

As described above, it becomes possible to form a protective film on the inner wall surface of a processing container of a plasma processing apparatus, and to suppress the formation of a protective film on the top surface of a mounting table without using a dummy substrate.

Hereinafter, various exemplary embodiments will be described in detail with reference to the accompanying drawings. In the drawings, identical or corresponding components will be denoted by the same symbols.

FIG. 1 is a flowchart illustrating a plasma processing method according to an exemplary embodiment. Method MT illustrated in FIG. 1 refers to a method in which a protective film is formed on the inner wall surface of a processing container of a plasma processing apparatus without mounting an object (e.g., a dummy substrate) on a mounting table, and then, a predetermined processing on a workpiece is performed according to predetermined process conditions in a state where the workpiece (hereinafter, the workpiece may be referred to as a "wafer W") is mounted on the mounting table.

Figure 2:
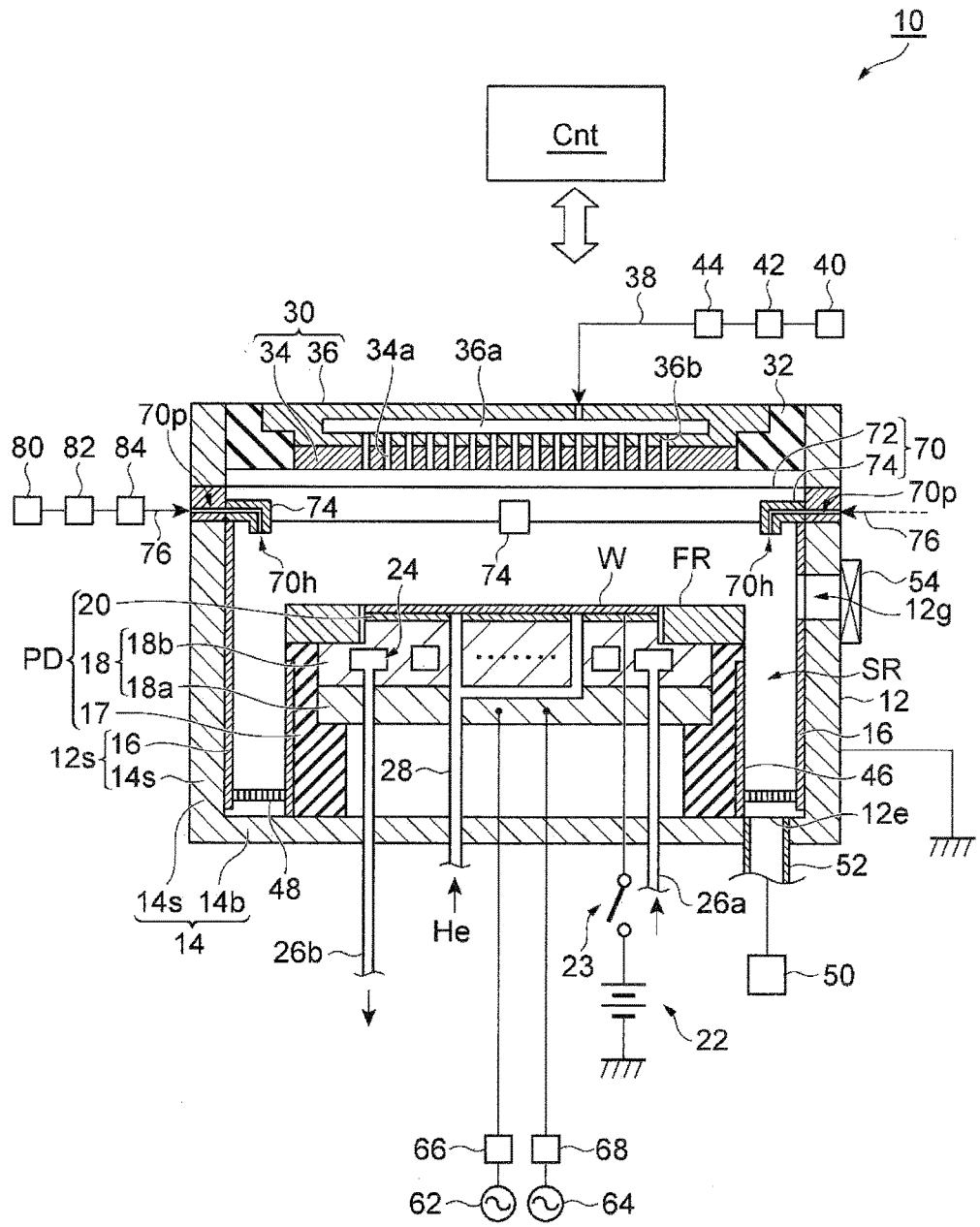
FIG. 2 is a view schematically illustrating an exemplary plasma processing apparatus that may be used for performing the plasma processing method illustrated in FIG. 1.

FIG. 2 is a view schematically illustrating an exemplary plasma processing apparatus that may be used for performing the plasma processing method illustrated in FIG. 1. The plasma processing apparatus 10 illustrated in FIG. 2 is a capacitively coupled plasma processing apparatus, and includes a substantially cylindrical processing container 12. The processing container 12 includes a container body 14 and a shield member 16.

The container body 14 includes a side wall portion 14s and a bottom portion 14b. The side wall portion 14s has a substantially cylindrical shape. The bottom portion 14b is continued to the lower end of the side wall portion 14s, and forms the bottom portion of the processing container 12. The container body 14 is made of, for example, aluminum, and subjected to an anodic oxidization treatment on the inner wall surface thereof. That is, the inner wall surface of the container body 14 has an anodized aluminum coating. In addition, the container body 14 is grounded.

The shield member 16 is to suppress deposit from being formed on the inner wall surface of the container body 14. The shield member 16 has a substantially cylindrical shape, and extends along the side wall portion 14s of the container body 14. The shield member 16 is formed by forming a ceramic coating called yttrium oxide on, for example, a surface of an aluminum material or a surface of an anodized aluminum coating formed on a surface of a base material. The shield member 16 forms the side wall 12s of the processing container 12 together with the side wall portion 14s of the container body 14. In addition, when a reaction product is deposited on the shield member 16, the reaction product is removed by dry cleaning. When the shield member 16 is consumed since the shield member 16 has been used two or more times (e.g., the dry cleaning has been performed two or more times), the shield member 16 may be reused by forming the coating again.

An opening 12g is formed in the side wall 12s of the processing container 12. The opening 12g is a passage through which a wafer W passes when the wafer W is carried into the processing container 12 or the wafer W is carried out from the processing container 12. The opening 12g is configured to be opened/closed by a gate valve 54.

A mounting table PD is provided within the processing container 12. The mounting table PD includes a support unit 17, a lower electrode 18, and an electrostatic chuck 20. The support unit 17 has a substantially cylindrical shape. The support unit 17 is formed of, for example, an insulation material. The support unit 17 extends vertically from the bottom portion of the processing container 12 within the processing container 12. The support unit 17 supports the lower electrode 18 and the electrostatic chuck 20.

The lower electrode 18 includes a first plate 18a and a second plate 18b. The first plate 18a and the second plate 18b are formed of a metal (e.g., aluminum), and has substantially a disc shape. The second plate 18b is provided on the first plate 18a, and is conductive with the first plate 18a.

The electrostatic chuck 20 is installed on the second plate 18b. The electrostatic chuck 20 provides the top surface of the mounting table PD, i.e., a wafer W mounting surface. The electrostatic chuck 20 has a structure in which an electrode, which is a conductive film, is disposed between a pair of insulation layers or insulation sheets. A direct current (DC) power source 22 is electrically connected to an electrode of the electrostatic chuck 20 via a switch 23. The electrostatic chuck 20 attracts a wafer W by an electrostatic force (e.g., a Coulomb force) generated by the DC voltage from the DC power source 22. Accordingly, the electrostatic chuck 20 is capable of holding the wafer W.

On the peripheral edge of the second plate 18b, a focus ring FR is mounted to enclose the edge of the wafer W and the electrostatic chuck 20. The focus ring FR has a substantially annular plate shape. The focus ring FR is formed of a material that is suitably selected depending on a plasma processing to be performed on the wafer W. For example, the focus ring FR may be formed of a material such as, for example, silicon, quartz, or SiC.

A coolant flow path 24 is formed inside the second plate 18b. A coolant is supplied to the coolant flow path 24 from a chiller unit installed outside the processing container 12 through a pipe 26a. The coolant supplied to the coolant flow path 24 returns to the chiller unit through a pipe 26b. In this way, the coolant is circulated between the coolant flow path 24 and the chiller unit. By controlling the temperature of the coolant, the temperature of the wafer W supported by the electrostatic chuck 20 is controlled in the range of, for example, −20° C. to 100° C. In addition, in the case where the temperature of the wafer W is controlled to be high, the temperature of the wafer W may be controlled by, for example, a heater provided to the second plate 18b.

In addition, a gas supply line 26 is formed in the plasma processing apparatus 10. The gas supply line 28 supplies a heat transfer gas supplied from a heat transfer gas supply mechanism (e.g., He gas) to a gap between the top surface of the electrostatic chuck 20 and the rear surface of the wafer W.

In addition, the plasma processing apparatus 10 is provided with an upper electrode 30. The upper electrode 30 is installed above the mounting table PD, and disposed to face the mounting table PD. The upper electrode 30 is supported on the upper portion of the processing container 12 through an insulative blocking member 32. In one exemplary embodiment, the upper electrode 30 includes a ceiling plate 34 and a support 36. The ceiling plate 34 defines the space within the processing container 12 from the upper side. The ceiling plate 34 may be made of, for example, quartz that is formed of silicon oxide, single crystal silicon or amorphous silicon that is formed of silicon, aluminum, or an aluminum member having an anodic oxidation coating formed on a surface thereof. The support 36 removably supports the ceiling plate 34.

The upper electrode 30 provides a first ejection unit of an exemplary embodiment. That is, the upper electrode 30 is configured to eject a gas to be used for processing the wafer W. More specifically, the ceiling plate 34 includes a plurality of gas ejection holes 34a that is formed to extend downwardly. In an exemplary embodiment, the ceiling plate 34 is formed of silicon. A gas diffusion chamber 36a is formed inside the support 36. A plurality of gas communicating holes 36b extends downwardly from the gas diffusion chamber 36a so as to communicate with the gas ejection holes 34a, respectively, A pipe 38 is connected to the gas diffusion chamber 36a. A gas source group 40 is connected to the pipe 38 via a valve group 42 and a flow rate controller group 44. The gas source group 40 includes a plurality of gas sources. The valve group 42 includes a plurality of valves, and the flow rate controller group 44 includes a plurality of flow rate controllers such as, for example, mass flow controllers. The plurality of gas sources of the gas source group 40 are connected to the pipe 38 via the corresponding valves in the valve group 42 and the corresponding controllers in the flow rate controller group 44, respectively.

The plurality of gas sources of the gas source group 40 are sources of a plurality of species of gases for processing the wafer W. Hereinafter, descriptions will be made on, for example, a case in which the processing of the wafer W is etching of an etching target layer, and thus, a gas source will be exemplified according to the type of the film of an etching target layer.

When the etching target layer of the wafer W is a silicon containing anti-reflection film (e.g., a silicon oxide film), the plurality of gas sources include a fluorocarbon gas source and/or a hydrofluorocarbon gas source. In such a case, the plurality of gas sources may further include a rare gas source. For example, the fluorocarbon gas is $CF_4$ gas, and the hydrofluorocarbon gas is $CHF_3$ gas. In addition, the rare gas may be any rare gas, for example, Ar gas.

When the etching target layer of the wafer W is a carbon containing film (e.g., an organic film or an amorphous carbon film), the plurality of gas sources include a hydrogen gas source and a nitrogen gas source. In such a case, the plurality of gas sources may further include a rare gas source. The rare gas may be any rare gas (e.g., Ar gas).

When the etching target layer of the wafer W is a silicon oxide film, the plurality of gas sources include a fluorocarbon gas source and/or a hydrofluorocarbon gas source. In such a case, the plurality of gas sources may further include a rare gas source. For example, the fluorocarbon gas is $CF_4$ gas, and the hydrofluorocarbon gas includes one or more of $CH_2F_2$ gas, $CH_3F$ gas, and $CHF_3$ gas. In addition, the rare gas may be any rare gas, for example, Ar gas.

When the etching target layer of the wafer W is a silicon nitride film, the plurality of gas sources include one or more of a fluorocarbon gas source, a hydrofluorocarbon gas source, and a trifluoride nitride gas. In such a case, the plurality of gas sources may further include a rare gas source. For example, the fluorocarbon gas includes one or more of $C_4F_6$ gas and $C_4F_8$, and the hydrofluorocarbon gas may be $CHF_3$ gas. In addition, the rare gas may be any rare gas, for example, Ar gas.

Figure 3:
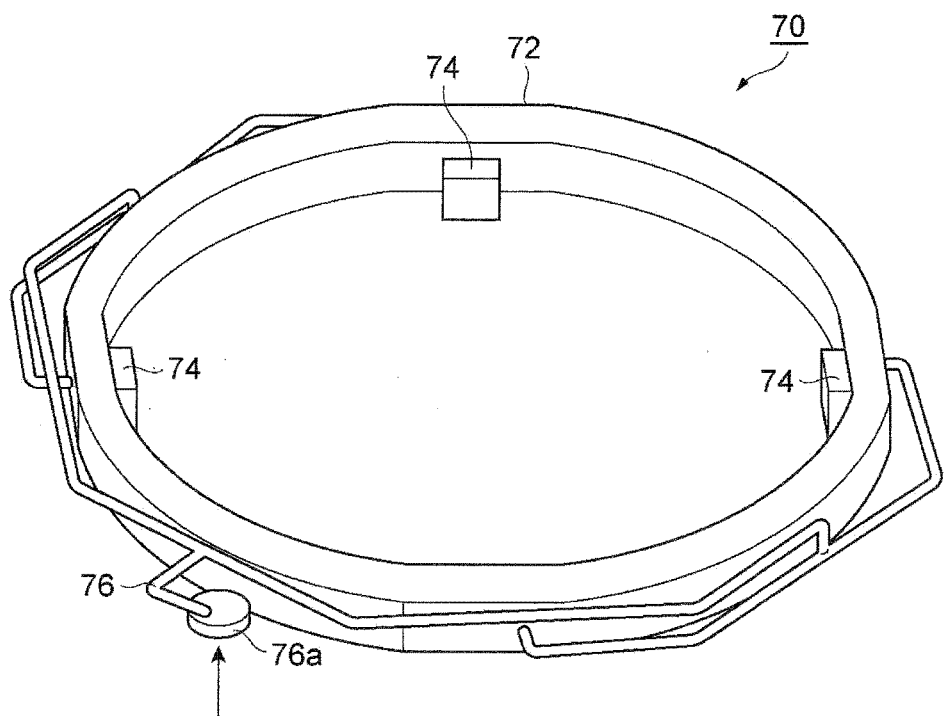
FIG. 3 is a perspective view illustrating a second ejection unit.

As illustrated in FIG. 2, the plasma processing apparatus 10 includes a second ejection unit 70 in addition to the upper electrode 30 that provides a first ejection portion. FIG. 3 is a perspective view illustrating a second ejection unit. Hereinafter, reference will be made to FIG. 3 together with FIG. 2. The second ejection unit 70 ejects a gas to be used for forming a protective film on the inner wall surface of the processing container 12.

The second ejection unit 70 is provided at the side wall 12s side of the processing container 12 with respect to the first ejection unit. The second ejection unit 70 is configured to eject the gas from the upper side a space SR between the mounting table PD and the side wall 12s toward the space SR. Specifically, the second ejection unit 70 provides a plurality of gas ejection holes 70h, each of which has an opening end above the space SR. In addition, the number of gas ejection holes is not limited as long as a plurality of gas ejection holes are provided, and may be, for example, four (4) or more.

The plurality of gas ejection holes 70h are arranged in the circumferential direction around the central axis of the processing container 12 that extends in the vertical direction. For example, the plurality of gas ejection holes 70h are evenly arranged in the circumferential direction. In addition, the plurality of gas ejection holes 70h illustrated in FIG. 2 extend vertically downwardly toward the opening ends thereof so as to eject the gas downwardly. However, the plurality gas ejection holes 70h may be opened in a direction toward the central axis. Alternatively, the plurality of gas ejection holes 70h may be inclined to approach the central axis as they go toward the opened ends located at the lower side. In addition, the plurality of gas ejection holes 70h may be arranged outside the outer peripheral edges of the mounting table PD and the focus ring FR, and may be arranged at a position close to the side wall within the processing container 12. As a result, a protective film can be formed on the inner wall surface within the processing container 12 without forming the protective film on the top surface of the mounting table PD and the top surface of the focus ring FR so that the generation of a contaminant and particles can be further suppressed.

In an exemplary embodiment, the second ejection unit 70 includes an annular member 72 and a plurality of gas ejection blocks 74. The annular member 72 has a substantially annular shape. The annular member 72 is supported by the side wall 12s. More specifically, the annular member 72 is sandwiched between the upper portion and the lower portion of the side wall 12s. The plurality of gas ejection blocks 74 are members that provide the plurality of gas ejection holes 70h, and are supported by the annular member 72. The annular member 72 and the plurality of gas ejection blocks 74 include a plurality of gas lines 70b that are formed to communicate with the plurality of gas ejection holes 70h, respectively. The plurality of gas lines 70b are connected to the pipe 76. The pipe 76 extends from an input end 76a, and is branched on the midway to be connected to the plurality of gas lines 70b. For example, the pipe 76 is configured such that the distances from the input end 76a to the plurality of gas lines 70b are substantially equal to each other.

In addition, the second ejection unit 70 may be configured to include a plurality of nozzles that extend from the annular member 72 toward the center within the processing container 12. In addition, the annular member 72 may be configured to extend within the processing container 12 in its entire circumference. Even in such a case, the plurality of gas ejection holes 70b are opened downwardly to eject the gas toward the space SR.

The gas source group 80 is connected to the input end 76a of the pipe 76 via the valve group 82 and the flow rate controller group 84. The gas source group 80 includes one or more gas sources for forming a protective film. In one exemplary embodiment, the one or more gas sources are silicon containing gas sources. The silicon containing gas may be, for example, $SiF_4$ gas, $SiCl_4$ gas, or $SiH_4$ gas. In addition, the one or more gas sources may further include a rare gas source. The rare gas may be any rare gas, for example, Ar gas. In addition, the one or more gas sources may further include a hydrocarbon gas source and/or a hydrofluorocarbon gas source. The hydrocarbon gas may be, for example, $CH_4$ gas. The hydrofluorocarbon gas may be, for example, $CH_2F_2$ gas. The one or more gas sources are connected to the input end of the pipe 76 via the corresponding valves in the valve group 82 and the corresponding controllers in the flow rate controller group 84, respectively.

As illustrated in FIG. 2, a shield member 46 is installed along the outer peripheral surface of the mounting table PD. The shield member 46 is to suppress deposit from being formed on the outer peripheral surface of the mounting table PD. The shield member 46 is formed by forming a ceramic coating called yttrium oxide on, for example, a surface of an aluminum material.

A baffle plate 48 is provided between the mounting table PD and the side wall 12s of the processing container 12. The baffle plate 48 may be formed by coating ceramic such as, for example, yttrium oxide on an aluminum material. A plurality of through holes are formed in the baffle plate 48.

Below the baffle plate 48, an exhaust port 12e is formed in the processing container 12. An exhaust apparatus 50 is connected to the exhaust port 12e via an exhaust pipe 52. The exhaust apparatus 50 may include a vacuum pump such as, for example, a pressure regulating valve and a turbo molecular pump, and may decompress the space within the processing container 12 to a desired degree of vacuum.

In addition, the plasma processing apparatus 10 further includes a first high frequency power supply 62 and a second high frequency power supply 64. The first high frequency power supply 62 is a power supply that generates high frequency waves for plasma generation, and generates high frequency waves having a frequency of 27 MHz to 100 MHz. The first high frequency power supply 62 is connected to the lower electrode 18 via a matcher 66. The matcher 66 includes a circuit to match the output impedance of the first high frequency power supply 62 and the input impedance of the load side (the lower electrode 18 side) with each other. In addition, the first high frequency power supply 62 may be connected to the upper electrode 30 via the matcher 66.

The second high frequency power supply 64 is a power supply for generating high frequency bias to draw ions into a wafer W, and generates high frequency bias having a frequency in the range of 400 kHz to 13.56 MHz. The second high frequency power supply 64 is connected to the lower electrode 18 via a matcher 68. The matcher 68 includes a circuit to match the output impedance of the second high frequency power supply 64 and the input impedance of the load side (the lower electrode 18 side) with each other.

In an exemplary embodiment, the plasma processing apparatus 10 may further conclude a controller Cnt. The controller Cnt is a computer that includes, for example, a processor, a storage unit, an input device, and a display device, and controls each unit of the plasma processing apparatus 10. In the controller, an operator may perform, for example, an input operation of commands using the input device in order to manage the plasma processing apparatus 10, and the working situation of the plasma processing apparatus 10 may be visualized and displayed by the display device. In addition, a control program for controlling various processings executed in the plasma processing apparatus 10, or a program for causing a processing to be executed in each unit of the plasma processing apparatus 10 according to a processing condition, i.e., a processing recipe is stored in the storage unit of the controller Cnt. For example, the controller Cnt may store a processing recipe for method MT, and control each unit of the plasma processing apparatus 10 according to the processing recipe.

Figure 4:
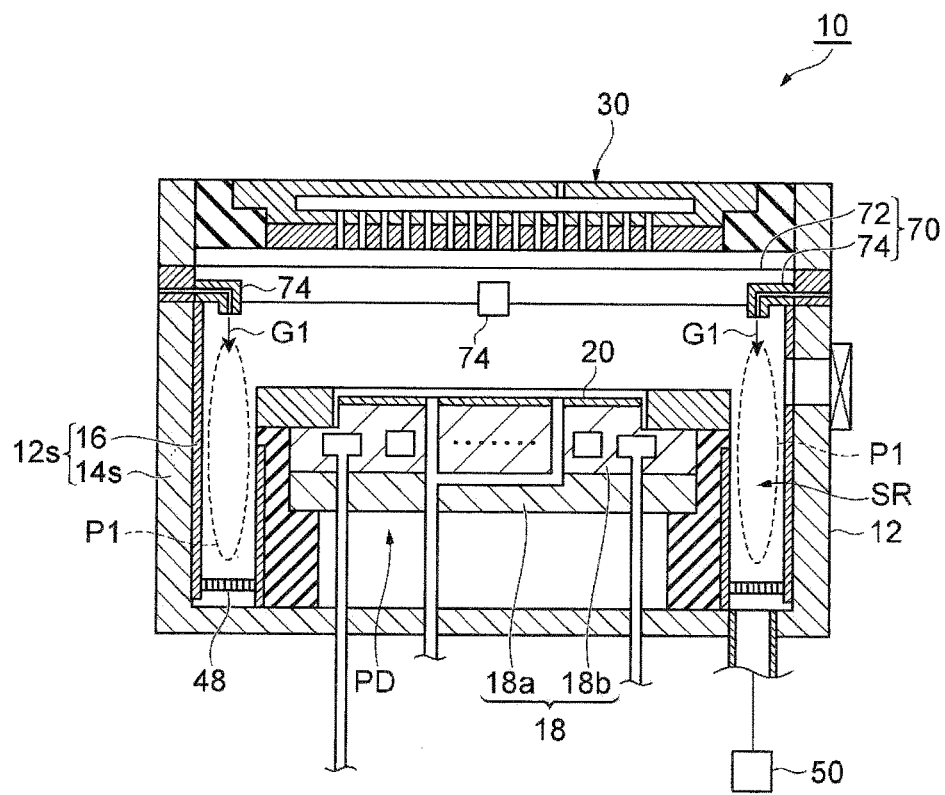
FIG. 4 is a view illustrating a state of the plasma processing apparatus in the process of performing the plasma processing method illustrated in FIG. 1.
Figure 5:
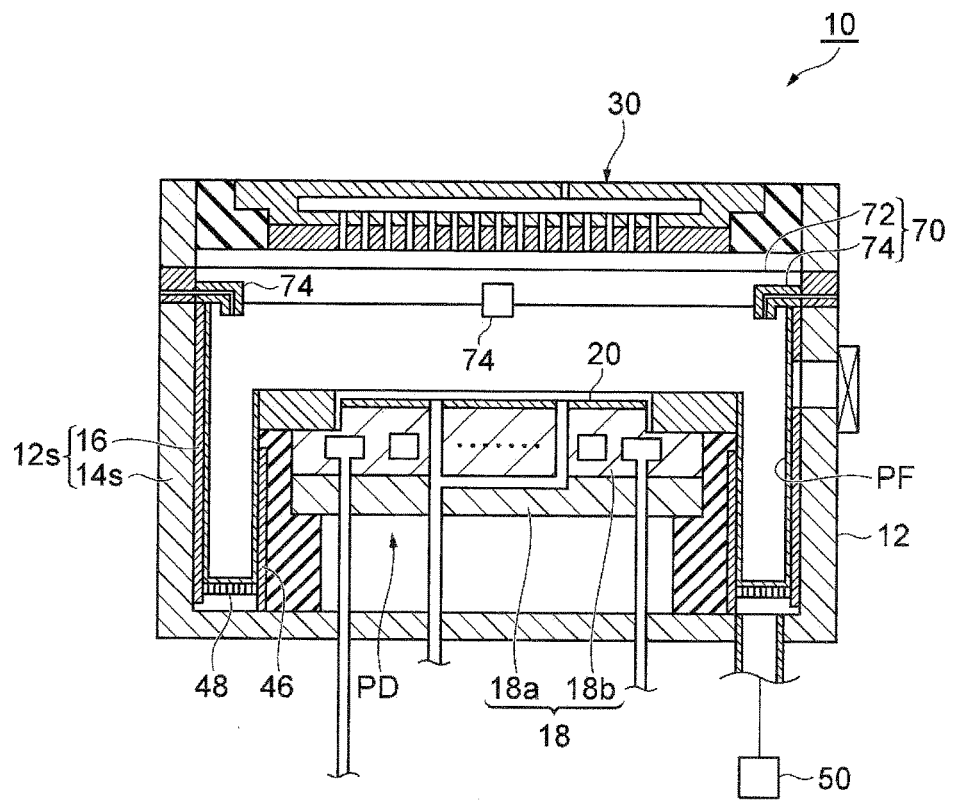
FIG. 5 is a view illustrating a state of the plasma processing apparatus in the process of performing the plasma processing method illustrated in FIG. 1.
Figure 6:
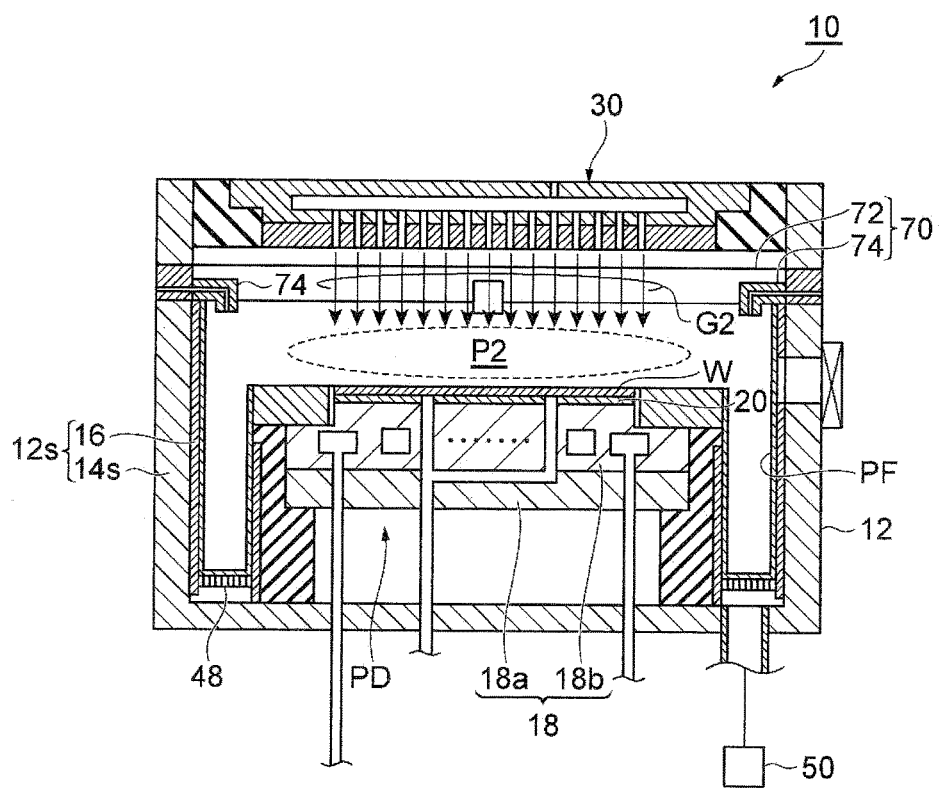
FIG. 6 is a view illustrating a state of the plasma processing apparatus in the process of performing the plasma processing method illustrated in FIG. 1.
Figure 7A:
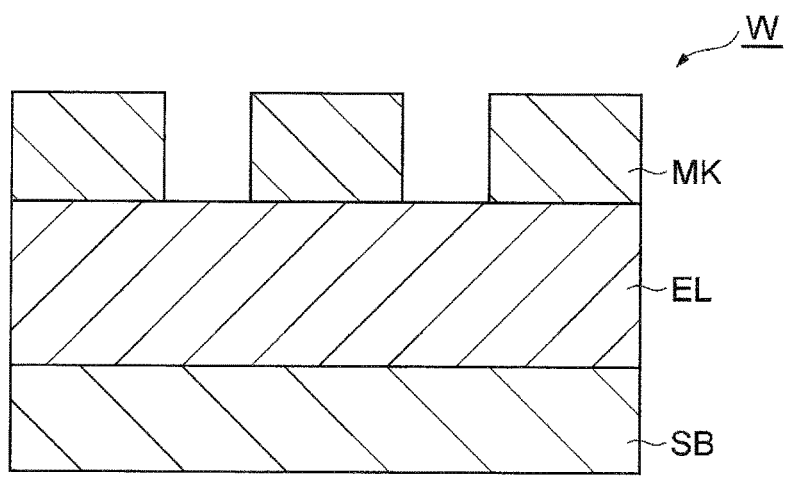
FIGS. 7A and 7B are cross-sectional views of a workpiece for describing etching of an etching target layer.
Figure 7B:
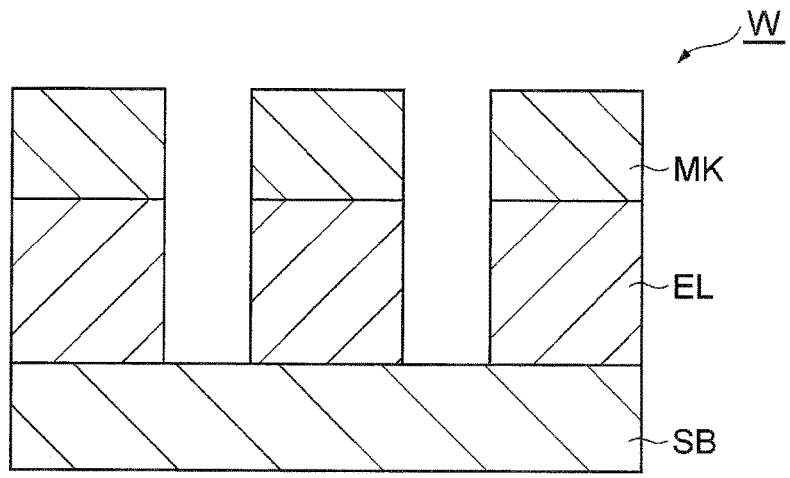

Hereinafter, method MT will be described in detail with reference to FIG. 1 again. In the following description, reference will be further made to FIGS. 4 to 6 and FIGS. 7A and 7B. FIGS. 4 to 6 are views illustrating the states of the plasma processing apparatus in the process of performing the plasma processing method illustrated in FIG. 1. FIGS. 7A and 7B are cross-sectional views of a workpiece for describing etching of an etching target layer. Hereinafter, method MT will be described with reference to a case in which a plasma etching is performed using the plasma processing apparatus 10, as an example.

As illustrated in FIG. 1, in method MT, step ST1 is executed first. In step ST1, a processing of forming a protective film on the inner wall surface of the processing container 12 of the plasma processing apparatus 10 is executed. As illustrated in FIG. 4, step ST1 is executed in the state where a wafer W is not mounted on the electrostatic chuck 20.

In step ST1, a protective film forming gas is supplied into the processing container 12 from the second ejection unit 70. The gas ejected from the second ejection unit 70 forms a gas flow directed toward the space SR as indicated by arrows G1 in FIG. 4, i.e., a gas flow following the side wall 12s. Therefore, a gas flow directed toward the top surface of the mounting table PD (i.e., the top surface of the electrostatic chuck 20) is suppressed. In addition, in step ST1, the pressure of the space within the processing container 12 is set to a predetermined pressure by the exhaust apparatus 50. As a result, a gas flow is formed which is directed to the space SR from the second ejection unit 70 along the side wall 12s and then exhausted through the baffle plate 48, and a gas flow directed to the top surface of the electrostatic chuck 20 from the second ejection unit 70 is further suppressed. In addition, in step ST1, high frequency waves from the first high frequency power supply 62 are supplied to the lower electrode 18. As a result, plasma P1 of the protective film forming gas is generated within the outer peripheral space of the mounting table PD and the focus ring FR. That is, the plasma P1 is formed in a region following the side wall 12s.

Ions in a gas dissociated by the generation of the plasma P1 react to the wall surface near the gas flow from the second ejection unit 70 (i.e., the inner wall surface of the processing container 12) to be deposited thereon. Specifically, the inner wall surface includes the inner wall surface of the side wall 12s, the outer peripheral surface of the mounting table PD, and the surface of the baffle plate 48. As a result of executing step ST1, a protective film PF is formed on the inner wall surface of the processing container 12, as illustrated in FIG. 5. In addition, as described above, since the gas flow from the second ejection unit 70 is generated in a region following the side wall 12s, the formation of the protective film on the top surface of the electrostatic chuck 20 is suppressed even if a dummy substrate is not mounted on the electrostatic chuck 20.

In the subsequent step ST2, a wafer W is carried into the processing container W. Then, the wafer W is mounted on the electrostatic chuck 20, and held by the electrostatic chuck 20.

In the subsequent step ST3, a gas is supplied into the processing container 12 from the upper electrode 30 (first ejection unit) for the plasma processing of the wafer W (in the present example, the plasma etching of an etching target film). As illustrated by arrows G2 in FIG. 6, the gas supplied from the upper electrode 30 forms a flow directed toward the wafer W. In addition, in step ST3, the pressure of the space within the processing container 12 is set to a predetermined pressure by the exhaust apparatus 50. In addition, in step ST3, high frequency waves from the first high frequency power supply 62 are supplied to the lower electrode 18. As a result, plasma P2 is generated above the wafer W. In addition, in step ST3, high frequency waves from the second high frequency power supply 64 may be supplied to the lower electrode 18.

Active species of molecules or atoms in a gas dissociated by the generation of the plasma gas P2 are irradiated to the wafer W. As a result, a plasma processing of the wafer W (in the present example, etching of an etching target film) is performed. For example, as illustrated in FIG. 7A, the active species are irradiated to a region exposed from the mask (MK) in the entire region of the etching target layer EL formed on the substrate SB. As a result, the etching target layer EL is etched, as illustrated in FIG. 7B.

When step ST3 of method MT is executed, the erosion of the inner wall surface of the processing container 12 by the active species is suppressed by the protective film PF formed in step ST1. As a result, a contaminant (e.g., particles) is suppressed from adhering to the wafer W.

In addition, according to method MT, it is possible to form a protective film on the inner wall surface of the processing container of a plasma processing apparatus, and to suppress the formation of a protective film on the top surface of a mounting table (i.e., the top surface of an electrostatic chuck) without using a dummy substrate.

In addition, an example the protective film forming gas is a silicon containing gas (e.g., $SiF_4$ gas, $SiCl_4$ gas, or $SiH_4$ gas). From the gas, a protective film PF containing silicon is formed. The protective film PF has a resistance against an etching gas for the above-mentioned silicon containing anti-reflection film, an etching gas for a carbon containing film, an etching gas for a silicon oxide film, and an etching gas for a silicon nitride film. That is, the protective film PF enables the etching selectivity for an etching target film to be improved with respect to the protective film PF.

In addition, the protective film forming gas may contain a hydrocarbon gas and/or a hydrofluorocarbon gas. For example, the protective film forming gas may contain $CH_4$ gas and/or $CH_2F_2$ gas. According to this protective film forming gas, a forming speed of the protective film PF, i.e., a deposition rate is enhanced. In addition, a harder protective film PF is formed. That is, the etching resistance of the protective film PF is improved.

In addition, as described above, the etching target layer EL may be a silicon containing anti-reflection film, a carbon containing film, a silicon oxide film, or a silicon nitride film. In order to etch these films, the gases exemplified above may be used.

While various exemplary embodiments have been described, various modifications may be made without being limited to the above-described exemplary embodiments. For example, in performing method MT, a plasma processing apparatus other than a capacitively coupled plasma processing apparatus may be used. For example, an inductively coupled plasma processing apparatus or a plasma processing apparatus that excites a gas by surface waves such as, for example, microwaves, may be used for performing method MT.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A plasma processing method comprising:
    forming a protective film on an inner wall surface of a processing container of a plasma processing apparatus; and
    executing a processing on a workpiece within the processing container,
    wherein the plasma processing apparatus includes:
    a mounting table provided within the processing container, and configured to mount the workpiece thereon;
    a first ejection unit provided above the mounting table, and configured to eject a gas toward the workpiece mounted on the mounting table; and
    a second ejection unit provided at a side wall side of the processing container with respect to the first ejection unit, and configured to eject a gas from an upper side of a space between the mounting table and the side wall of the processing container toward the space, and wherein, in the forming the protective film, a protective film forming gas is ejected from the second ejection unit to generate plasma, and, in the executing the processing on the workpiece, a workpiece processing gas is ejected from the first ejection unit in a state where the workpiece is mounted on the mounting table to generate plasma.

2. The plasma processing method of claim 1, wherein a baffle plate formed with a plurality of through holes is provided between the mounting table and the side wall, and an exhaust apparatus is connected to the processing container below the baffle plate.

3. The plasma processing method of claim 1, wherein in the executing the processing on the workpiece, an etching target film of the workpiece is etched.

4. The plasma processing method of claim 1, wherein the protective film forming gas includes a silicon containing gas.

5. The plasma processing method of claim 4, wherein the protective film forming gas further includes a hydrocarbon gas or a hydrofluorocarbon gas.

6. The plasma processing method of claim 1, wherein the plasma processing apparatus is a capacitively coupled plasma processing apparatus and further includes an upper electrode provided above the mounting table, and the upper electrode includes the first ejection unit.

7. The plasma processing method of claim 1, wherein the second ejection unit is provided on the side wall at a location above the mounting table.

* * * * *